Figure 1:
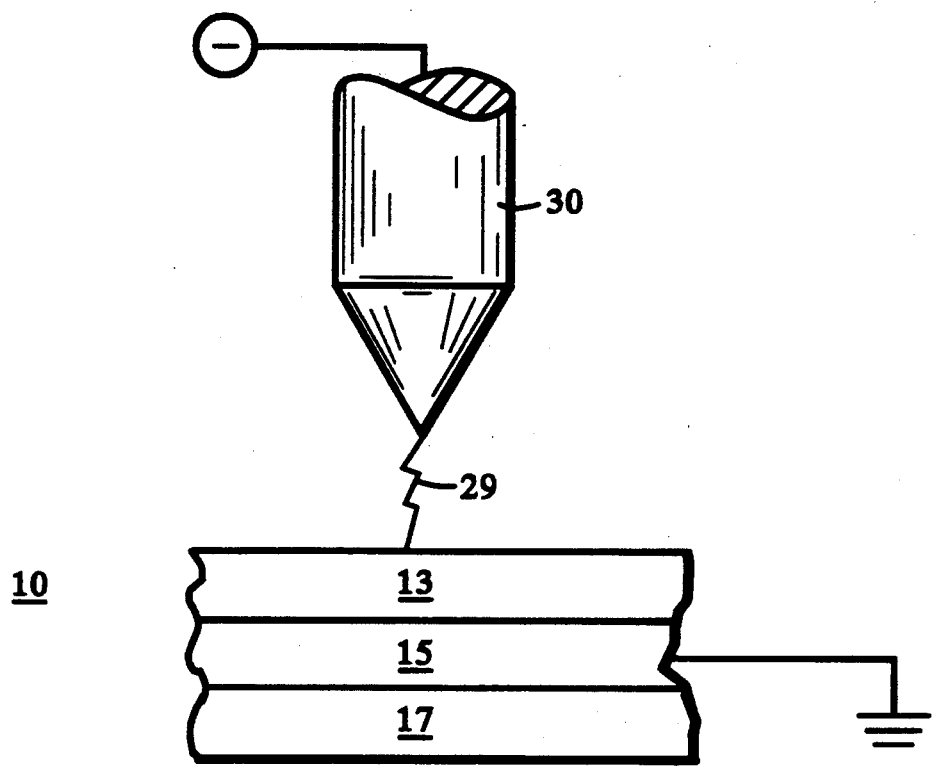

United States Patent [19]

Nowak et al.

[11] Patent Number: 5,217,829

[45] Date of Patent: Jun. 8, 1993

[54] METHOD FOR PRODUCING PHOTOMASKS

[75] Inventors: Michael T. Nowak, Gardner, Mass.; Thomas E. Lewis, E. Hampstead, N.H.

[73] Assignee: Presstek, Inc., Hudson, N.H.

[21] Appl. No.: 807,788

[22] Filed: Dec. 12, 1991

Related U.S. Application Data

[63] Continuation of Ser. No. 483,359, Feb. 22, 1990, abandoned.

[51] Int. Cl.$^5$ ............................................. G03F 9/00
[52] U.S. Cl. .................................. 430/5; 430/198; 427/123; 346/135.1; 378/35; 428/457
[58] Field of Search .................. 430/5, 198; 427/123; 346/135.1; 378/35; 428/457

[56] References Cited

U.S. PATENT DOCUMENTS

| | | | |
|---|---|---|---|
| 2,983,220 | 5/1961 | Dalton et al. | 428/514 |
| 3,158,506 | 9/1961 | Ellison | 346/134 |
| 3,283,704 | 11/1966 | Dalton | 427/143 |
| 3,411,948 | 11/1968 | Reis | 430/5 |
| 3,509,088 | 9/1966 | Dalton | 428/327 |
| 3,934,503 | 1/1976 | Kinney et al. | 101/128.21 |
| 4,082,902 | 4/1978 | Suzuke et al. | 427/457 |
| 4,188,880 | 2/1980 | Figov et al. | 101/128.21 |
| 4,291,119 | 9/1981 | Kido et al. | 430/348 |
| 4,304,806 | 12/1981 | Anderson et al. | 428/450 |
| 4,309,495 | 1/1982 | Ernsberger | 430/5 |
| 4,376,943 | 3/1983 | Bahr et al. | 346/135.1 |
| 4,383,016 | 5/1983 | Postupack | 430/5 |
| 4,392,143 | 7/1983 | Bahr et al. | 346/135.1 |
| 4,459,604 | 7/1984 | Kudelski et al. | 346/163 |
| 4,550,061 | 10/1985 | Sachdev et al. | 346/135.1 |
| 4,554,562 | 11/1985 | Afzali-Ardakami et al. | 346/135.1 |
| 4,567,490 | 1/1986 | Afzali-Ardakami et al. | 346/135.1 |
| 4,596,733 | 6/1986 | Cohen et al. | 428/209 |
| 4,617,579 | 10/1986 | Sachdev et al. | 346/135.1 |
| 4,622,262 | 11/1986 | Cohen | 346/135.1 |
| 4,830,909 | 5/1989 | Cohen et al. | 428/331 |
| 4,836,106 | 6/1989 | Afzali-Ardakani et al. | 400/241.1 |
| 4,894,279 | 1/1990 | Sachdev et al. | 428/216 |
| 4,911,075 | 3/1990 | Lewis et al. | 346/162 |
| 4,915,519 | 4/1990 | Afzali-Ardakani et al. | 400/120 |
| 5,023,156 | 6/1991 | Takeuchi et al. | 430/5 |
| 5,084,331 | 1/1989 | Afzali-Ardakani et al. | 346/135.1 |
| 5,091,052 | 2/1992 | Nowak et al. | 219/69.17 |

FOREIGN PATENT DOCUMENTS

| | | |
|---|---|---|
| 0113005 | 7/1984 | European Pat. Off. |
| 6430786 | 2/1989 | Japan . |
| WO84/02308 | 6/1984 | PCT Int'l Appl. |

OTHER PUBLICATIONS

Kirk-Othmer, "Encyclopedia of Chemical Technology", 3rd Ed., vol. 10, pp. 216–227, 242 and 250–252, John Wiley & Sons, 1980.

*Primary Examiner*—Charles L. Bowers, Jr.
*Assistant Examiner*—Thomas R. Neville
*Attorney, Agent, or Firm*—Cesari and McKenna

[57] ABSTRACT

A novel photomask structure and method of producing photomasks using a non-contacting spark-discharge recording apparatus. The recording constructions of the present invention comprise a conductive layer, a layer transparent to the radiation that will be used to expose the target photosensitive material and, optionally, a coating layer deposited over the metal layer.

8 Claims, 1 Drawing Sheet

METHOD FOR PRODUCING PHOTOMASKS

I. BACKGROUND OF THE INVENTION

This is a continuation of U.S. Ser. No. 07/483,359, filed on Feb. 22, 1990, now abandoned.

A. FIELD OF THE INVENTION

The present invention relates to production of photomasks, and more particularly to a method for producing photomasks using spark-discharge recording techniques, as well as constructions therefor.

B. Description of the Related Art

Photosensitive media find application in a wide variety of industrial and commercial contexts. These include preparation of offset lithography masters, printed circuit boards and silkscreen stencils.

In typical applications, a photosensitive substrate is exposed to a source of illumination that passes through a transparency containing a negative rendition (typically in black-and-white tones) of the image to be printed, thereby exposing the non-image portions of the substrate. Hereinafter, this transparency is referred to as the "mask" or "photomask". The substrate is then developed using conventional or specialized photochemical processes, resulting in a finished article having the desired black-and-white pattern imprinted thereon.

Conventionally, the mask is also prepared photographically. For example, a camera can be employed to record an image onto sheet film coated with a photosensitive silver halide emulsion, and the latter subjected to conventional development and fixation processes. This method, while reliable, suffers from the expense and inconvenience associated with "wet" processes generally. The silver halide emulsion adds further cost to the transparency material.

Offset lithography plates are produced by selectively modifying the surface characteristics of a blank so as to facilitate image retention and transfer. In one common arrangement, the surface of a blank plate ordinarily repels organic materials, such as ink, but is receptive to water. Upon exposure to suitable radiation (generally followed by some type of development process), the affinities of the surface material reverse, with the exposed areas becoming ink-receptive and water-repellent. Accordingly, one can impress an ink-transfer pattern on the blank by exerting control over the portions of the blank that receive exposure to the actinic radiation. This control is provided by the mask, which is introduced between the blank and the source of radiation.

A similar process can be used to etch a finished printed circuit board from a blank having a conductive layer that is sensitive to radiation. Introduction of a suitably imaged mask between a blank ensures that only the proper portions of the blank receive radiation. Either the exposed or unexposed portions are removed during the etching process.

In screen printing, an imaging substance such as ink or a dispersion of toner particles is passed through a partially blocked porous mesh screen to a receiving substrate. The non-image areas of the screen are blocked with a suitable material impervious to the imaging substance in a pattern corresponding to a reversal of the desired image. The ink can be applied to the screen and directed therethrough by pressure and/or electrostatic forces.

The patterned mesh screen, or stencil, is generally prepared using some form of photoresist to selectively furnish the ink-impermeable non-image areas. In one commonly used process, a hydrocolloid (e.g., gelatin or polyvinyl alcohol) that has been treated so as to polymerize upon exposure to illumination is first coated on the blank porous mesh; additional coatings are then applied, as necessary, to avoid pinholes.

The prepared screen is then exposed to a source of illumination that passes through a suitably patterned photomask. In this case, however, the mask contains a positive rendition of the final image, rather than a negative. The exposed screen is transformed into a finished printing screen by "development" (e.g., washing with water jets) to remove the unpolymerized coating material.

One method of preparing the mask comprises projecting the on-film image recorded by a camera onto a piece of sheet film coated with a photosensitive silver halide emulsion, and subjecting the latter to conventional development and fixation processes. This photographic method suffers from the same shortcomings outlined above with respect to wet photographic processes generally.

One can largely avoid these disadvantages by using the spark-erosion recording technique described in U.S. Pat. No. 4,188,880. This technique offers speed, convenience, and appreciable reduction in the cost of producing each photomask, as well as amenability to computer control. However, currently used spark-discharge methods of photomask imaging can achieve only comparatively large minimum feature sizes, and they require rather complex blanks.

II. DESCRIPTION OF THE INVENTION

A. Objects of the Invention

It is accordingly one object of the invention to create positive or negative photomasks using a dry process that does not involve chemical transformations, yet obtain fine features and better line definition than are possible with the dry processes currently in use.

It is another object of the invention to provide constructions for photomasks that are less expensive to manufacture than those obtainable using current techniques.

It is a further object of the invention to use a dry process to produce silkscreen positives that may be used to produce finished photomasks from a variety of blank constructions.

It is yet another object of the present invention to provide a method of using non-contact spark-discharge recording techniques to produce photomasks.

Other objects will, in part, be obvious and will, in part, appear hereinafter. The invention accordingly comprises the several steps and the relation of one or more of such steps with respect to the others, as well as apparatus relating thereto, all as exemplified in the following summary and detailed description, and the scope of the invention will be indicated in the claims.

B. SUMMARY OF THE INVENTION

The method of the present invention comprises use of a non-contacting spark-discharge recording apparatus (such as that described U.S. Pat. No. 4,911,075, the contents of which are hereby incorporated by reference) to destroy, at selected points, the top "masking layer" of a composite substrate to reveal a second transparent "image-transmission layer" thereunder. The process of selective removal is hereinafter referred to as "imaging".

This type of imaging system has been applied to direct lithographic and mask printing, where the spark-discharge device itself produces the necessary surface feature changes, and a single plate is used repeatably to print multiple copies of the same images. As far as we are aware, however, the technique has not been used to produce photomasks. Because no contact is made between the imaging electrode and our substrates, the diameter of the electrode tip does not limit the size of the smallest imageable point. Furthermore, the construction of our substrates can be relatively simple, because they need not withstand the intense heat and physical contact pressure associated with prior art equipment.

In our method, a digital representation of the negative or positive image that is to be transferred to the photosensitive material is stored as a datafile accessible by a suitably programmed computer. The computer directs the operation of control circuitry that manipulates the position of the spark-discharge electrode with respect to the construction to be imaged, and causes firing of the electrode when appropriate.

It should be understood that the choice between positive and negative image rendering depends both on the nature of the final product and the inclination of the designer. For example, as discussed hereinabove, by its nature the silkscreen process ordinarily entails use of a photomask having a positive pattern corresponding to the desired inking pattern. Lithographic plates, on the other hand, can be exposed either through a negative or positive photomask, depending on the type of plate. See, e.q., P. Hartsuch, *Chemistry for the Graphic Arts* (1983) at 127-178 for a description of negative and positive lithographic plates.

After imaging is completed, the composite substrate will have transparent areas corresponding to negative or positive portions of the final image, depending on design choice, with the remaining areas opaque. This finished construction is used as the screen mask that intervenes between the source of illumination and the photosensitive material during exposure thereof.

C. BRIEF DESCRIPTION OF THE DRAWING

The foregoing discussion will be understood more readily from the following detailed description of the invention, taken in conjunction with the single figure of the drawing, in which is depicted a cross-sectional view of a composite structure suitable for use with the method of the present invention.

D. DETAILED DESCRIPTION OF THE INVENTION

Referring to FIG. 1, reference numeral 10 denotes generally a cross-sectional view of a composite structure suitable for use with the method of the present invention to produce a photomask. The structure comprises an upper organic coating layer 13, an intermediate masking layer 15, and a bottom image-transmisison layer 17. As discussed below, organic coating layer 13 is optional.

Masking layer 15 is a conductive, preferably metal material that is susceptible to removal by the action of a high-voltage spark 29 produced by an imaging head 30.

Using the spark-discharge apparatus described in U.S. Pat. No. 4,911,075, we have obtained image details as small as 0.001 inch using zinc, aluminum or copper masking layers. Details regarding the characteristics and operation of the spark-discharge apparatus may be found in the copending application.

Generally, the masking layer should be thin, on the order of 300 to 750 angstroms, and can be applied using vapor deposition techniques, vacuum metallization, vacuum evaporation or sputtering methods. All of the foregoing techniques are well-characterized in the art.

Image-transmission layer 17 is a plastic film that allows passage therethrough of the radiation that will be used to expose the blank photosensitive material. Because this radiation usually falls within the optical spectrum (which includes infrared, visible and ultraviolet wavelengths), optically transparent material will ordinarily suffice. However, in order to preserve the imaging accuracy possible with the non-contacting spark-discharge method of the present invention, it is desirable to employ a film having an optical clarity greater than 99% transmission. Suitable plastic materials include polyester, polystyrene, polycarbonate, polymethylpentene, acetate, acrylic, polyolefin or polyether.

Using any of the aforementioned materials, the thickness of image-transmission layer 17 will preferably be greater than 0.001 inch (for toughness) but less than 0.01 inch (to preserve optical clarity and minimize cost). In an especially preferred embodiment, the thickness of image-transmission layer 17 ranges from 0.005 to 0.007 inch.

Although not mandatory, it is sometimes desirable to add an organic coating layer 13 above masking layer 15 to protect the masking layer from scratching, and/or to add color thereto; the added color can serve to enhance the opacity of masking layer 15, facilitate evaluation of the coating for quality, or serve as an identifier. In order to preserve imaging accuracy, this layer must permit spark 29 to evaporate it or pass therethrough without altering the spark's path. Suitable silicone coatings are described in our U.S. Pat. No. 4,911,075.

III. CONCLUSION

The invention described herein offers a blank photomask structure suitable for spark-discharge imaging that is simpler than prior-art structures, and does not require special lubricity characteristics. The method of the present invention facilitates fine feature definition, rapid and cost-effective imaging, as well as amenability to computer control.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of producing a photomask for use in conjunction with a photosensitive substrate, the method comprising the steps of:
   a. providing a construction comprising:
      i. a conductive layer, and
      ii. a layer thereunder substantially transparent to radiation for exposing a photosensitive substrate;
   b. causing relative movement between the construction and a non-contacting spark-discharge recording apparatus located proximately thereto; and c. removing the conductive layer at selected points by spark discharge.

2. The method of claim 1 wherein the photosensitive substrate is a screen-printing stencil.

3. The method of claim 1 wherein the photosensitive substrate is a circuit board blank.

4. The method of claim 1 wherein the photosensitive substrate is a lithographic printing plate.

5. A method of exposing a photosensitive substrate comprising the steps of:
   a. forming a photomask according to steps comprising:
      i. positioning a substrate, on which a mask is to be formed, adjacent a non-contacting spark-discharge recording apparatus;
      ii. causing relative movement between said construction and said apparatus; and
      iii. selectively removing material with said apparatus at points on said substrate corresponding to selected points on the photosensitive substrate that are to be exposed to radiation;
   b. directing radiation capable of altering the surface characteristics of the photosensitive material through the mask and onto the photosensitive material, thereby permitting the radiation to alter the surface characteristics of the photosensitive material at the selected points.

6. The method of claim 6 wherein the photosensitive substrate is a screen-printing stencil.

7. The method of claim 6 wherein the photosensitive substrate is a circuit board blank.

8. The substrate of claim 6 wherein the photosensitive substrate is a lithographic printing plate.

* * * * *